US010262858B2

United States Patent
Yoshida et al.

(10) Patent No.: US 10,262,858 B2
(45) Date of Patent: *Apr. 16, 2019

(54) SURFACE FUNCTIONALIZATION AND PASSIVATION WITH A CONTROL LAYER (71) Applicants: Applied Materials, Inc., Santa Clara, CA (US); The Regents of the University of California, Oakland, CA (US)

(72) Inventors: Naomi Yoshida, Sunnyvale, CA (US); Lin Dong, San Jose, CA (US); Andrew Kummel, San Diego, CA (US); Jessica Kachian, Sunnyvale, CA (US); Mary Edmonds, San Diego, CA (US); Steve Wolf, San Diego, CA (US)

(73) Assignees: Applied Materials, Inc., Santa Clara, CA (US); The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/496,982

(22) Filed: Apr. 25, 2017

(65) Prior Publication Data

US 2017/0309479 A1    Oct. 26, 2017

Related U.S. Application Data (60) Provisional application No. 62/327,110, filed on Apr. 25, 2016.

(51) Int. Cl.
*H01L 21/02* (2006.01)

(52) U.S. Cl.
CPC .. *H01L 21/02532* (2013.01); *H01L 21/02112* (2013.01); *H01L 21/02381* (2013.01);
(Continued)

(58) Field of Classification Search
CPC ......... H01L 21/02532; H01L 21/02112; H01L 21/02381; H01L 21/02395; H01L 21/02389; H01L 21/02398
See application file for complete search history.

(56) References Cited

U.S. PATENT DOCUMENTS

| | | | |
|---|---|---|---|
| 2005/0159017 A1* | 7/2005 | Kim | C23C 16/345 438/791 |
| 2005/0181633 A1 | 8/2005 | Hochberg et al. | |

(Continued)

FOREIGN PATENT DOCUMENTS

| | | |
|---|---|---|
| EP | 2730676 A1 | 5/2014 |
| JP | 2008-258591 A | 10/2008 |
| JP | 2009-102740 A | 5/2009 |

OTHER PUBLICATIONS

T. Kent et al., "InGaAs (110) Surface Cleaning Using Atomic Hydrogen", online since Sep. 2014, Trans Tech Publications Inc., Solid State Phenomena, vol. 219, pp. 47-51, 2015.*
(Continued)

*Primary Examiner* — William F Kraig
*Assistant Examiner* — Pavel G Ivanov
(74) *Attorney, Agent, or Firm* — Patterson + Sheridan, LLP (57) ABSTRACT

Embodiments described herein relate to semiconductor and metal substrate surface preparation and controlled growth methods. An example application is formation of an atomic layer deposition (ALD) control layer as a diffusion barrier or gate dielectric layer and subsequent ALD processing. Embodiments described herein are believed to be advantageously utilized concerning gate oxide deposition, diffusion barrier deposition, surface functionalization, surface passivation, and oxide nucleation, among other processes. More specifically, embodiments described herein provide for sili-
(Continued)

con nitride ALD processes which functionalize, passivate, and nucleate a $SiN_x$ monolayer at temperatures below about 300° C.

20 Claims, 8 Drawing Sheets

(52) U.S. Cl.
CPC .. *H01L 21/02389* (2013.01); *H01L 21/02395* (2013.01); *H01L 21/02398* (2013.01)

(56) References Cited

U.S. PATENT DOCUMENTS

| | | | | |
|---|---|---|---|---|
| 2006/0286774 | A1* | 12/2006 | Singh | C23C 16/0227 438/478 |
| 2014/0273529 | A1* | 9/2014 | Nguyen | H01L 21/0217 438/792 |
| 2015/0259791 | A1 | 9/2015 | Hausmann et al. | |
| 2017/0040158 | A1* | 2/2017 | Kachian | H01L 21/0228 |

OTHER PUBLICATIONS

International Search Report and Written Opinion for International Application No. PCT/US2017/029422.
Vogt et. al., Nitridation and CVD Reactions with Hydrazine, AIChE Journal, Oct. 1995, 41(10), pp. 2282-2291.
Morishita et. al., Atomic-layer Chemical-vapor-deposition of Silicon-nitride, Appl. Surf. Sci., (1997), 112, pp. 198-204.
Yeh et. al., Low-temperature Chemical-vapor-deposition of Silicon-nitride Film from Hexachloro-disilane and Hydrazine, J. J. Appl. Phys., 35, (1996), pp. 1509-1512.
Riedel et. al., Low Temperature Deposition of Silicon Nitride using Si3Cl8, Thin Solid Films, (2015), 577, pp. 114-118.
Ma et. al., Making Silicon Nitride Film a Viable Gate Dielectric, IEEE Trans. On. Electrical Devices, (1998), 45(3), pp. 580-690.
Lu et. al., p-Type SiGe Transistors with Low Gate Leakage Using SiN Gate Dielectric, IEEE Electron Device Lett, (1999), 20(10), pp. 514-516.
Yoshioka et. al., Deposition of Silicon Nitride Films by the Silane-Hydrazine Process, J. of Electrochemical Society: Solid State Sci., (1967), pp. 962-964.
Mizuta et.al., Low Temperature Growth of GaN and AlN on GaAs Utilizing Metalorganics and Hydrazine, Jpn. J. Appl. Phys., 25 (1986), 5 pp.
Pearton et. al., Damage Introduction in InP and InGaAs during Ar and H2 Plasma Exposure, Appl. Phys. Lett., 61, 586 (1992), 4 pp.
El Kazzi et. al., Thermally Stable, Sub-nanometer Equivalent Oxide Thickness Gate Stack for Gate-first In0.53Ga0.47As Metal-oxide-semiconductor Field-effect-transistors, Appl. Phys. Lett. 100, 063505 (2012), 4 pp.
El Kazzi et. al., Sub-nm equivalent Oxide Tthickness on Si-passivated GaAs Capacitors with Low Dit, Appl. Phys. Lett. 99, 052102 (2011), 4pp.
Auth et. al., A 22nm High Performance and Low-Power CMOS Technology Featuring Fully-Depleted Tri-Gate Transistors, Self-Aligned Contacts and High Density MIM Capacitors, Symposium on VLSI Technology Digest of Technical Papers, (2012), pp. 131-132.
Lin et. al., Increase in Current Density for Metal Contacts to N-Germanium by Inserting TiO2 Interfacial Layer to Reduce Schottky Barrier Height, Appl. Phys. Lett. 98, 092113 (2011), 4 pp.
Kondo et. al, Growth and Energy Bandgap Formation of Silicon Nitride Films in Radical Nitridation, Y. Jpn. J. Appl. Phys 2007, 46, pp. 71-75.
Wu et. al., Thermal Nitridation of the Si?(111?)-?(7X7)? Surface Studied by Scanning Tunneling Microscopy and Spectroscopy, Phys Review B, 2002, 65, 6 pp.

* cited by examiner

SURFACE FUNCTIONALIZATION AND PASSIVATION WITH A CONTROL LAYER

CROSS-REFERENCE TO RELATED APPLICATIONS

This application claims benefit of U.S. provisional patent application Ser. No. 62/327,110, filed Apr. 25, 2016, the entirety of which is herein incorporated by reference.

BACKGROUND

Field

Embodiments of the present disclosure generally relate to semiconductor devices and semiconductor device formation methods. More specifically, embodiments described herein relate to surface functionalization and passivation utilizing a control layer.

Description of the Related Art

In semiconductor fabrication processes, functionalization is generally referred to as a process or material which makes a substrate surface reactive to atomic layer deposition (ALD) precursors. Passivation generally includes forming a monolayer or thin control layer on a substrate material surface which leaves the Fermi level unpinned. Monolayer nucleation is referred to as initiation of the ALD process in each unit cell.

Existing silicon nitride ALD processes are often performed at relatively high temperatures (above about 310° C. for plasma based processing). Many silicon nitride ALD processes further utilize high temperature annealing (>350° C.) to achieve stoichiometric Si—$N_x$ films with high quality electrical properties. However, high temperature fabrication processes can exceed the thermal budgets of materials in advanced node devices, which make device fabrication more difficult and increase the probability of device failure. In addition, conventional ALD processes can be inefficient due to large precursor volumes and long precursor pulse times.

Accordingly, what is needed in the art are improved methods and materials for semiconductor device fabrication.

SUMMARY

In one embodiment, a substrate process method is provided. The method includes functionalizing a substrate surface by exposing the substrate surface to hydrazine ($N_2H_4$) material in a reaction chamber environment and exposing the substrate surface to a silicon chloride material in the reaction chamber environment. The exposing the substrate surface to a hydrazine material and the exposing the substrate surface to a silicon chloride material are repeated, the reaction chamber environment is maintained at a temperature below about 300° C. and an $SiN_x$ termination layer is formed on the substrate surface.

In another embodiment, a substrate process method is provided. The method includes exposing a substrate to hydrogen to preclean the substrate in a reaction chamber environment, exposing the substrate to a hydrazine material in a first exposure operation, and exposing the substrate to a silicon chloride material in a second exposure operation. The substrate is exposed to the hydrazine material in a third exposure operation and an amount of hydrazine material utilized in the third exposure operation is less than an amount of hydrazine utilized in the first exposure operation. The substrate is also exposed to the silicon chloride material in a fourth exposure operation and an amount of silicon chloride material utilized in the fourth exposure operation is less than an amount of silicon chloride material utilized in the second exposure operation. The third exposure operation and the fourth exposure operation are repeated, the reaction chamber environment is maintained at a temperature below about 300° C., and an $SiN_x$ termination layer is formed on the substrate.

In yet another embodiment, a substrate process method is provided. The method includes heating a reaction chamber environment to a temperature of greater than about 100° C. and precleaning a substrate in the reaction chamber environment. A surface of the substrate is functionalized by exposing the substrate to a hydrazine ($N_2H_4$) material, the reaction chamber is purged, and the substrate is exposed to a $Si_2Cl_6$ material in the reaction chamber environment. The exposing the substrate to a hydrazine material, the purging the reaction chamber environment, and the exposing the substrate to a $Si_2Cl_6$ material are sequentially repeated, the reaction chamber environment is maintained at a temperature below about 300° C., and an $SiN_x$ termination layer is formed on the surface of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure concerns semiconductor and metal substrate surface preparation and controlled growth methods. An example application is formation of an atomic layer deposition (ALD) control layer as a diffusion barrier or gate dielectric layer and subsequent ALD processing. Embodiments described herein are believed to be advantageously utilized concerning gate oxide deposition, diffusion barrier deposition, surface functionalization, surface passivation, and oxide nucleation, among other processes.

Embodiments described herein provide for silicon nitride ALD processes which functionalize, passivate, and nucleate a monolayer below about 300° C., for example, about 275° C., which is at an advantageously lower deposition temperature than conventional silicon nitride ALD processes.

ALD processes described herein can be utilized without high temperature post annealing after Si—$N_x$ film deposition, which enables reduced processing temperatures when compared to conventional ALD processes. Embodiments described herein enable high flux processing and utilization of an anhydrous nitrogen containing precursor (anhydrous hydrazine) during the ALD half cycle reactions to prevent undesirable oxygen and carbon contamination. Silicon nitride control layers formed according to the embodiments provided herein are suitable for nucleating various metal ALD precursors for gate oxide ALD or for nucleating further silicon growth with chlorosilane or silane precursors at reduced temperatures.

In one embodiment, an ALD method for deposition of a silicon nitride control layer using $Si_2Cl_6$ and $N_2H_4$ for application as a diffusion barrier or gate dielectric layer is provided. In certain embodiments, the silicon nitride control layer may be an amorphous silicon nitride materials. In another embodiment, the SiN control layer may be utilized in preparation for subsequent ALD processes on semiconductor surfaces.

For example, silicon nitride ALD process can functionalize, passivate, and/or nucleate a monolayer below about 300° C., such as below about 275° C. ALD processes described herein utilize $Si_2Cl_6$ and hydrazine pulses with reduced cycle lengths and reduced substrate temperatures. In one embodiment, the hydrazine is a vapor derived from a hydrazine organic solvent mixture which serves to keep the SiN surface free or substantially free of undesirable oxygen contamination during film deposition. In addition, SiN ALD films may be deposited without undesirable ammonium chloride-like crystal byproduct formation.

ALD silicon nitride growth processes described herein utilize a purge operation between half cycle precursor pulses to remove excess unreacted precursor from a reaction chamber. For example, the purge operation may utilize an inert gas, such as argon or the like, to purge the reaction chamber between half cycle pulses. A high vacuum base pressure it also utilized immediately prior to ALD growth to reduce or eliminate the presence of carbon and oxygen during ALD silicon nitride growth. In certain embodiments, the reaction chamber is equipped with a vaporizer which has a membrane that prevents or substantially prevents delivery of materials other than hydrazine vapor to the reaction chamber.

In one embodiment, an ALD $SiN_x$ monolayer or multilayer may be formed on various substrate materials, such as indium gallium arsenide (InGaAs), indium gallium antiminide (InGaSb), indium gallium nitride (InGaN), silicon germanium (SiGe), germanium, silicon, and other substrates of varying allow composition. It is contemplated that the ALD $SiN_x$ materials may be formed on metallic substrates.

In operation, the substrate surface is functionalized by —$NH_x$ termination by dosing high pressure pulses of $N_2H_4$ at about 275° C. Subsequently, $Si_2Cl_6$ is dosed at about 275° C. to produce a Si—$N_x$ terminating layer on the semiconductor surface through the production of a gaseous HCl byproduct. The cyclic dosing process may be repeated to produce a desired predetermined thickness of the deposited Si—$N_x$ overlayer.

The silicon nitride ALD processes described herein are based upon the saturating half-cycle reaction of hydrazine ($N_2H_4$) with the substrate semiconductor or metallic surface sites through a surface termination with —N—$H_x$ groups at a substrate temperature of about 275° C. Once the surface is terminated by —N—$H_x$, the second half-cycle reaction is initiated by introducing the chlorosilane precursor in order to produce a saturating —N—Si—$Cl_x$ terminating layer and a gaseous HCl desorption byproduct. Chlorosilane precursors include, but are not limited to $SiCl_4$, $Si_2Cl_6$, and $Si_3Cl_8$. It is contemplated that a precursor of $Si_xCl_yH_z$, where y>z, can be used in accordance with the embodiments described herein.

The silicon nitride passivation layer formed according to the embodiments described herein serves several purposes. It is noted the film may contain oxygen and the oxygen may enhance some of the electrical properties so the film can be denoted as $SiO_yN_x$ in certain embodiments. The dangling bonds of the substrate are transferred to silicon, which are then passivated by nitrogen, oxygen, and/or hydrogen, leaving the surface electrically passivated. The silicon nitride (or oxynitride) deposited overlayer with —$NH_x$ (and/or OH) termination may also react with an oxidant such as anhydrous HOOH(g) in order to create an Si—N—OH and Si—OH terminating layer. The terminating layer may react with nearly any metal ALD precursor, thus, eliminating utilization of metal precursor nucleation (for example, with trimethyl aluminum predosing), decreasing equivalent oxide thickness (EOT), and lowering border trap density and fixed charged associated with interfacial layers or even direct bonding of oxide to non-silicon semiconductors. The same procedure can be used for other crystallographic faces such as $In_xGa_{1-x}As(110)$, $In_xGa_{1-x}Sb(110)$, $In_xGa_{1-x}N(110)$, SiGe (001), and SiGe(110).

The $SiO_yN_x$ overlayer may also function as a channel diffusion barrier; for example, on InGaAs preventing In/Ga diffusion into the gate oxide or on SiGe or Ge preventing diffusion of Ge into the gate oxide. On SiGe or Ge, the $SiO_yN_x$ overlayer may create a Ge-free interface to the gate oxide. The $SiO_yN_x$ overlayer may also be employed for diffusion barrier applications during further metal oxide semiconductor (MOS) device processing operations. The Si—$N_x$ control layer may further be employed directly as a gate dielectric material, as silicon nitride is an inherently wide bandgap semiconductor material.

Experimental

In one embodiment, a silicon nitride ALD process on SiGe begins with a p-type $Si_{0.5}Ge_{0.5}$ (110) surface undergoing an ex-situ wet organic clean with a ten minute sonication in acetone, followed by ten minute sonication in IPA, and followed by ten minute sonication in water. The sample is then dipped into a beaker which contains a 2% HF/water solution with a layer of toluene on top for 2 minutes. After 2 minutes, the sample is pulled out through the layer of toluene and quickly transferred into the ultra high vacuum (UHV) chamber before the layer of toluene evaporates from the surface. This process is done in order to prevent the sample from being air exposed following the 2% HF dip. Once the sample is in UHV, an X-ray photoelectron spectroscopy (XPS) spectrum was taken of the surface with a monochromatic aluminum channel X-ray source system at a glancing angle of 30°.

Next, the sample is sequentially dosed with 315 MegaLangmuir anhydrous hydrazine, followed by 21 MegaLanmguir $Si_2Cl_6$, 3 MegaLangmuir anhydrous hydrazine, and 17 silicon nitride ALD cycles all dosed at a sample temperature of 275° C. Here each silicon nitride ALD cycle includes 3 MegaLangmuir $Si_2Cl_6$ followed by 3 MegaLangmuir hydrazine at 275° C. Following each dose and the 17 silicon nitride ALD cycles, an XPS spectrum was taken of the surface to compare against the as-loaded SiGe(110) surface.

Figure 1:
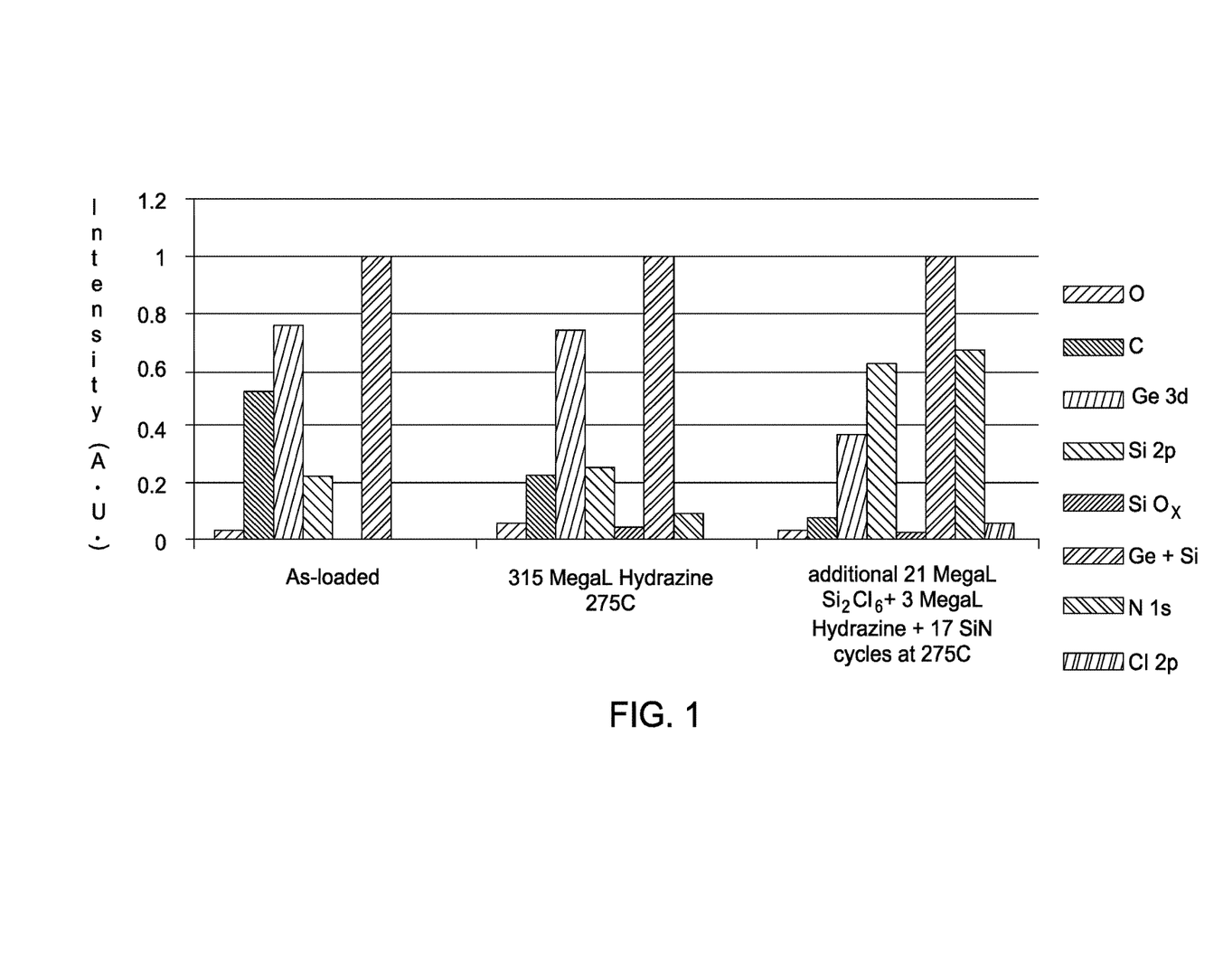
FIG. 1 illustrates x-ray photoelectron spectroscopy (XPS) data of ALD growth techniques according to embodiments described herein.

FIG. 1 illustrates the XPS raw counts corrected by Schofield photoionization cross sectional relative sensitivity factors are recorded for doublet peak pairs of Ge 3d, Si 2p, and Cl 2p and O 1s, C 1s, and N 1s peaks for the wet cleaned as-loaded $Si_{0.5}Ge_{0.5}$(110) surface, the 315 MegaLangmuir hydrazine dosed surface, the additional 21 MegaLangmuir $Si_2Cl_6$ dosed surface, and the additional 17 silicon nitride ALO cycle dosed surface. All doses were performed at a substrate temperature of 275° C.

The As-loaded SiGe(110) surface contains a large amount (50%) of carbon contamination and a small amount (<10%) of oxygen contamination. This is due to the ex-situ wet cleaning procedure not fully optimized at etching away unwanted surface contamination or protecting the etched surface from contamination during the sample transfer into vacuum. However, in practice, it is contemplated that an in-situ surface cleaning technique, such as the SICONI® process and atomic hydrogen cleaning, could leave the SiGe(110) surface free of oxygen and carbon contamination. The SICONI® process is available from Applied Materials, Inc., Santa Clara, Calif. It can be seen that the initial 315 MegaLangmuir hydrazine dose is able to remove more than half of the carbon contamination from the surface and also creates the —N—$H_z$ surface termination as seen by the presence of the N 1s signal.

Next, by dosing 21 MegaLangmuir $Si_2Cl_6$ followed by 3 MegaLangmuir hydrazine, and the 17 silicon nitride cycles, a large increase in the Si 2p and N 1s corrected peak areas is seen, as well as a decrease in the Ge 3d substrate peak, and the C 1s and O 1s surface contamination peaks. The results are consistent with silicon nitride ALD deposition occurring with no indication of undesirable contaminants being deposited within the silicon nitride film.

It was found that the ALD process produces an unwanted ammonium-chloride like powder byproduct when the reaction chamber and precursor lines are at 25° C. and a turbo molecular pump is employed to pump out gaseous byproducts and unreacted precursors from the reaction chamber. This was discovered by visibly seeing white powder in the ALD reaction chamber and on the surface of the sample following the 17 silicon nitride ALD cycles. The XPS results following the 17 silicon nitride cycles also shows a residual chlorine signal which can be attributed to the white powder left on the sample surface following the ALD process. Also, at room temperature, hydrazine and $Si_2Cl_6$ may stick to the chamber walls and react to form the unwanted powder byproduct, so testing was employed to determine the chamber temperature and pumping set-up utilized to avoid the undesirable formation of the powder byproduct.

The test chamber set-up included the ALD chamber with attached precursor dosing lines being connected to a dry pump, and the entire chamber, precursor dosing lines, and connecting line to the dry pump all heated for 12 hours to 125° C. 12 hours of heating time is employed to ensure all stainless steel vacuum components reach the temperature of >100° C., to ensure both precursors will not stick to the chamber walls and to eliminate the formation of the ammonium-chloride like powder byproduct. When the ALD process is carried out and several silicon nitride ALD cycles are introduced into the chamber (>100 cycles where each cycle consists of 3 MegaLangmuir hydrazine followed by 3 MegaLangmuir $Si_2Cl_6$) there was no powder detected in the ALO chamber, precursor dosing lines, or line connecting to the dry pump. In certain embodiments, chamber conditioning prior to the cyclic ALD dosing, which is effective to eliminate the unwanted formation of the powder byproduct by ensuring all stainless steel is above 100° C. prior to dosing. The silicon nitride process on was performed on $Si_{0.5}Ge$ (110) in the above described example, but the ALD process is believed to be advantageously employed with SiGe(001) and crystallographic faces of III-V substrates.

Figure 2:
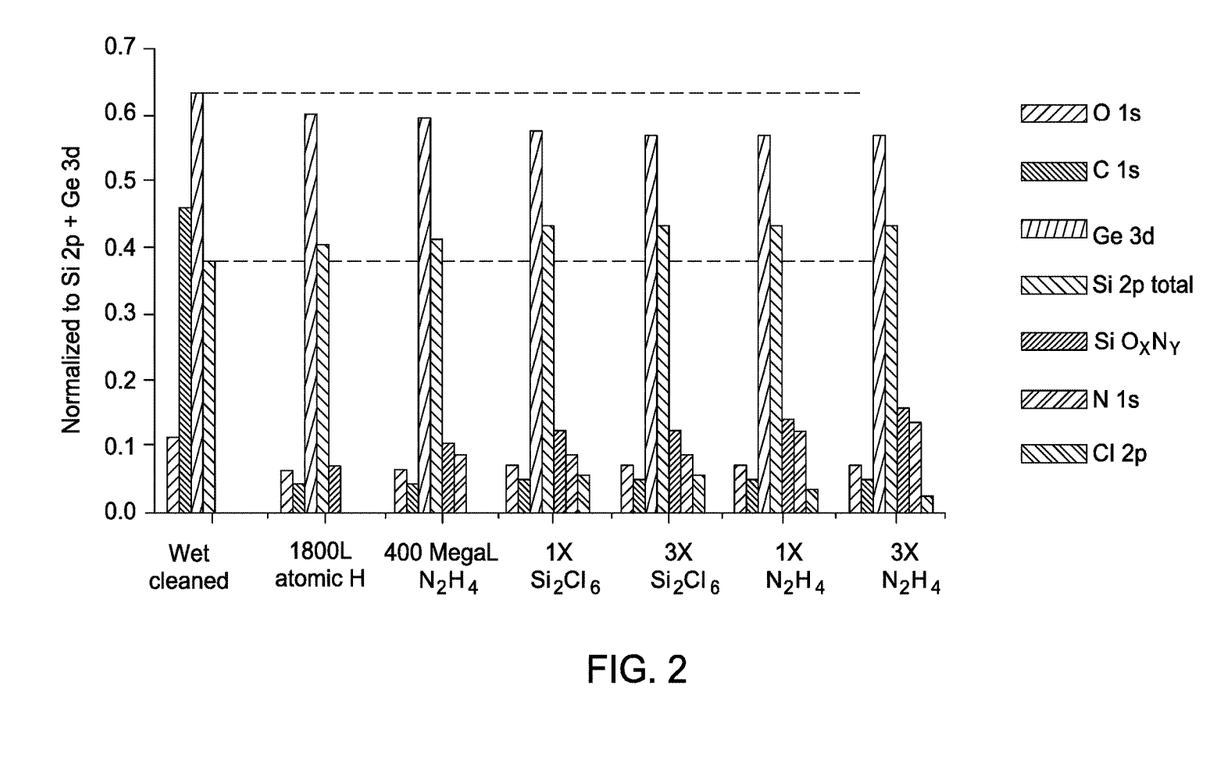
FIG. 2 illustrates XPS data of ALD growth techniques according to embodiments described herein.

With the hot wall set-up, an ALD saturation study was performed the $Si_{0.5}Ge_{0.5}$(110) surface. In order to start with the SiGe surface free of unwanted hydrocarbon contamination, an initial atomic hydrogen clean was performed at 330° C. using a thermal gas cracker in a preparation chamber. 1800 Langmuir atomic hydrogen was dosed and nearly all carbon was removed from the surface. Generally, FIG. 2 illustrates data of $SiN_x$ ALD half cycle saturation doses of $Si_2Cl_6$ and $N_2H_4$ on the $Si_{0.5}Ge_{0.5}$(110) surface at 285° C. following atomic H clean and $N_2H_4$ prepulse. More specifically, FIG. 2 illustrates the XPS results following the initial 1800 atomic hydrogen clean at 330° C., the hydrazine prepulse nitridation (400 MegaLangmuir), a 1×$Si_2Cl_6$ dose (13.5 MegaLangmuir), 3×$Si_2Cl_6$ dose (40.5 MegaLangmuir), 1×$N_2H_4$ (20 MegaLangmuir), and 3×$N_2H_4$ (60 MegaLangmuir) on $Si_{0.5}Ge_{0.5}$(110) at 285° C.

Both the $SiCl_x$ and $NH_x$ coverages saturate following a 1× pulse, indicating an ALD process occurs at 285° C. as indicated by no further increase in Si 2p or N 1s XPS corrected peak areas. Accordingly, ALD growth techniques according to the embodiments described herein enable a reduced growth temperature of about 285° C., in certain embodiments, and decreased cycle time by using the most reactive possible form of $N_2H_4$, which is anhydrous $N_2H_4$. Anhydrous $N_2H_4$ keeps the Si—$N_x$ surface free of unwanted oxygen contamination during film deposition, allowing a lower processing temperature to be utilized. As shown in FIG. 1 and FIG. 2, the $N_2H_4$ based $SiN_x$ ALD can be deposited on both H cleaned and wet cleaned SiGe.

Figure 3:
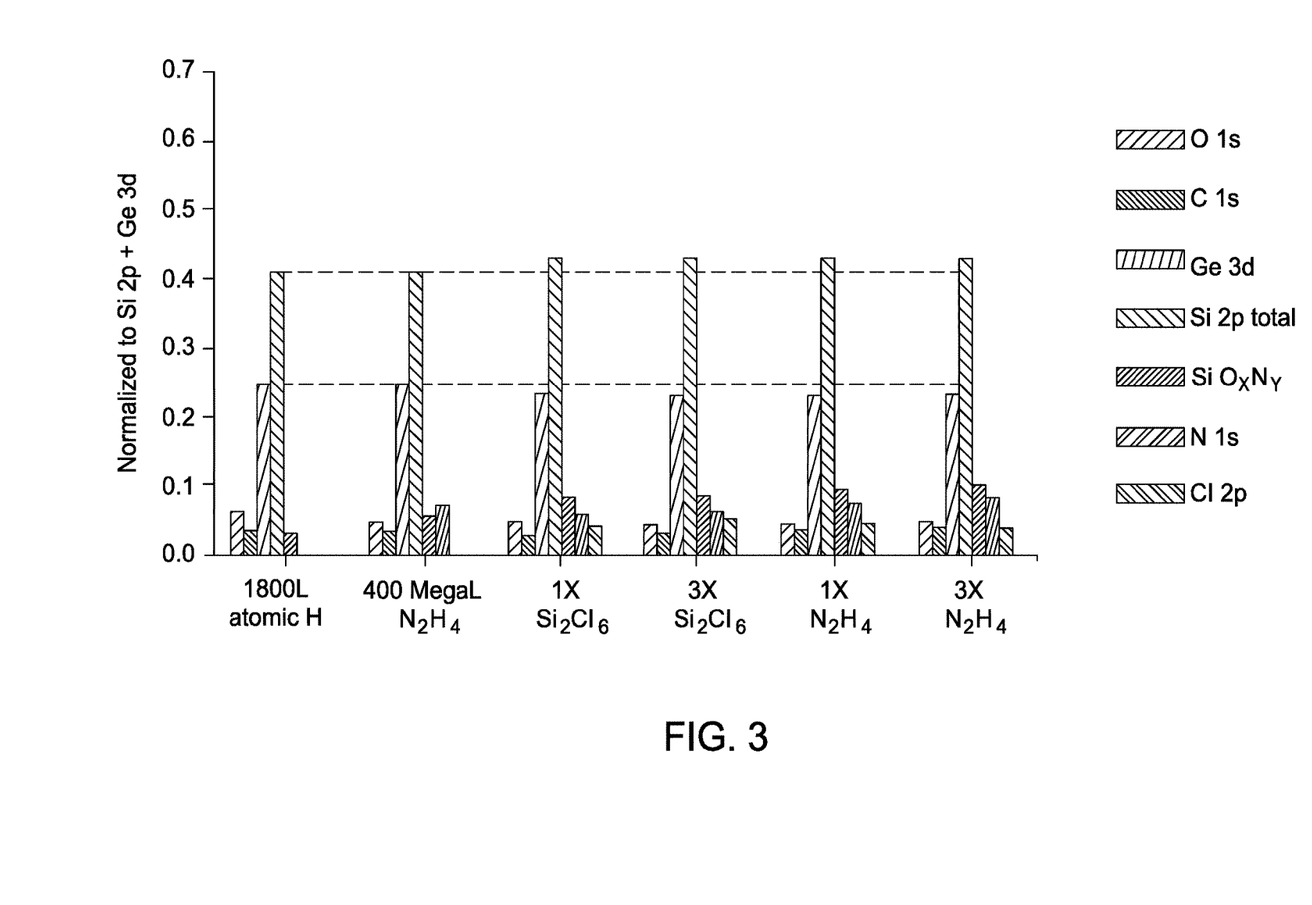
FIG. 3 illustrates XPS data of ALD growth techniques according to embodiments described herein

Subsequently, the $SiN_x$ ALD procedure was performed on the H cleaned $Si_{0.7}Ge_{0.3}$(001) in order to demonstrate the ALD process works independent of crystallographic face orientation. FIG. 3 illustrates the XPS results following the initial 1800 atomic hydrogen clean at 330° C., the hydrazine prepulse nitridation step (400 MegaLangmuir), a 1×$Si_2Cl_6$ dose (13.5 MegaLangmuir), 3×$Si_2Cl_6$ dose (40.5 MegaLangmuir), 1×$N_2H_4$ (20 MegaLangmuir), and 3×$N_2H_4$ (60 MegaLangmuir) on $Si_{0.7}Ge_{0.3}$(001) at 285° C. Both the $SiCl_x$ and $NH_x$ coverages saturate following a 1× pulse indicating an ALD process occurs at 285° C. as indicated by no further increase in Si 2p or N 1s XPS corrected peak areas.

Raw XPS peak area data (not illustrated) for Si 2p, N 1s, and Ge 2p peaks on the as-loaded wet cleaned $Si_{0.5}Ge_{0.5}$ (110), $Si_{0.5}Ge_{0.5}$(001), and $Si_{0.7}Ge_{0.3}$(001) surfaces following an 1800 Langmuir atomic hydrogen dose at 330° C., an additional 400 MegaLangmuir $H_4N_2$ dose at 285° C., and following an additional 20 $SiN_x$ ALD cycles at 285° C. was also collected and analyzed. On $Si_{0.5}Ge_{0.5}$(110), a large shifted Si 2p peak (68% of the total Si 2p signal) is indicative of $SiO_xN_y$ located at a binding energy of 101.7 eV, and the N 1s peak is located at 397.7 eV. A small higher binding energy Ge 2p component was seen at 1219.1 eV, indicative of $GeO_xN_y$ surface bonding after the initial $H_4N_2$ dose, with slightly more nitrogen found bonded to silicon (25% of Si 2p total corrected peak area signal) than nitrogen bonded to germanium (15% of Ge 2p total corrected peak area signal). Following the 20 $SiN_x$ ALD cycles, the intensity of the Ge 2p signal decreased by a factor of 5, indicating the deposited $SiN_x$ layer acts as a diffusion barrier preventing germanium out diffusion to the surface. Accordingly, the $SiN_x$ film deposited may function as a diffusion barrier in certain implementations.

Comparable results were observed on $Si_{0.5}Ge_{0.5}(001)$ and $Si_{0.7}Ge_{0.3}(001)$ surfaces whereafter the initial $H_4N_2$ dose, the large shifted $SiO_xN_y$ peak, located at 101.7 eV, made up approximately 70% of the total Si 2p signal on $Si_{0.5}Ge_{0.5}$ (001) and approximately 60% of the total Si 2p signal on $Si_{0.7}Ge_{0.3}(001)$. The N 1s peak was located at 397.7 eV on both 30% Ge and 50% Ge SiGe(001) surfaces. After the initial $H_4N_2$ dose, the $GeO_xN_y$ surface high binding energy component, located at binding energy 1219.1 eV, made up approximately 15% of the total Ge 2p signal on the $Si_{0.5}Ge_{0.5}(001)$ and $Si_{0.7}Ge_{0.3}(001)$ surfaces. Following an additional 20 $SiN_x$ ALD cycles, the intensity of the Ge 2p signal decreased by a factor of 10 and 8 on $Si_{0.7}Ge_{0.3}(001)$ and $Si_{0.5}Ge_{0.5}(001)$ surfaces, respectively, indicating that on both higher and lower Ge content SiGe(001) surfaces the $SiO_xN_y$ thin film creates a protective diffusion barrier preventing Ge out diffusion to the surface.

Figure 4A:
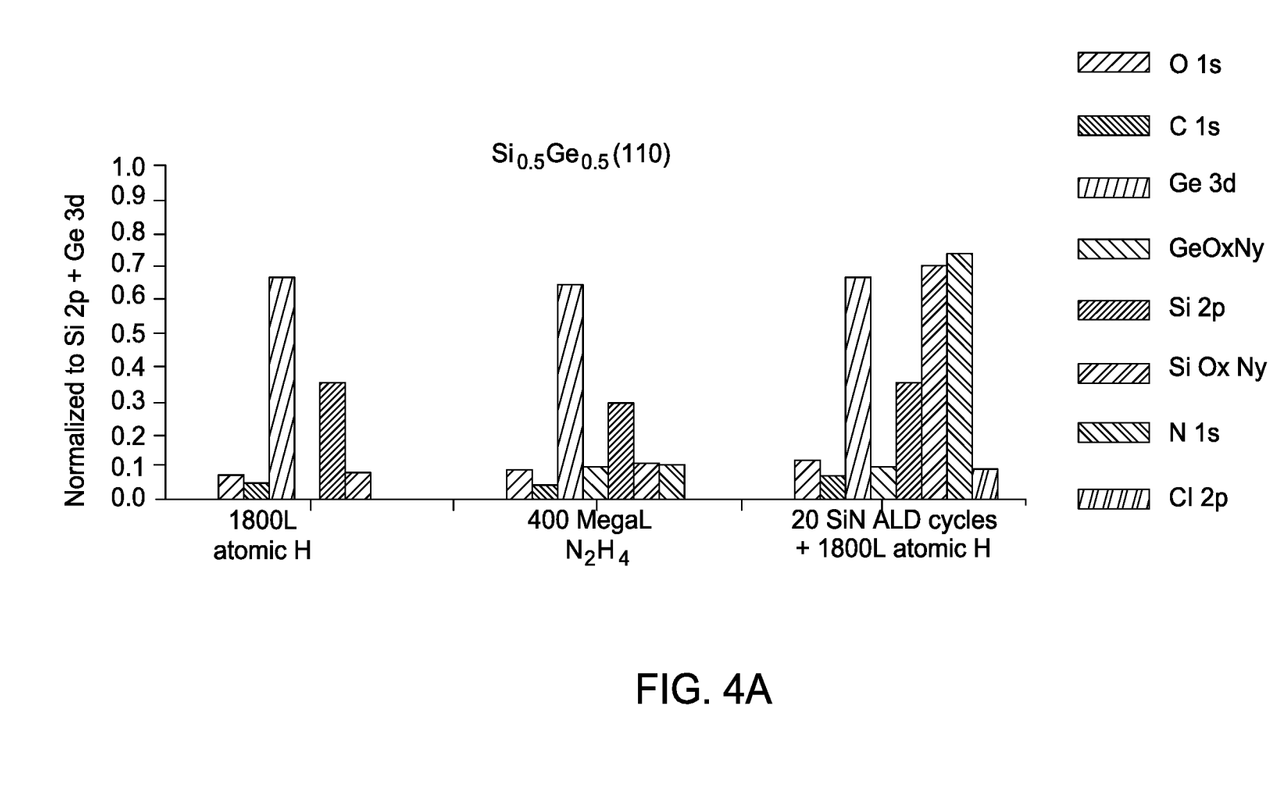
FIGS. 4A-C illustrate XPS surface compositions on various substrate compositions after ALD cycles with gaseous $H_4N_2$ and gaseous $Si_2Cl_6$ according to embodiments described herein.
Figure 4B:
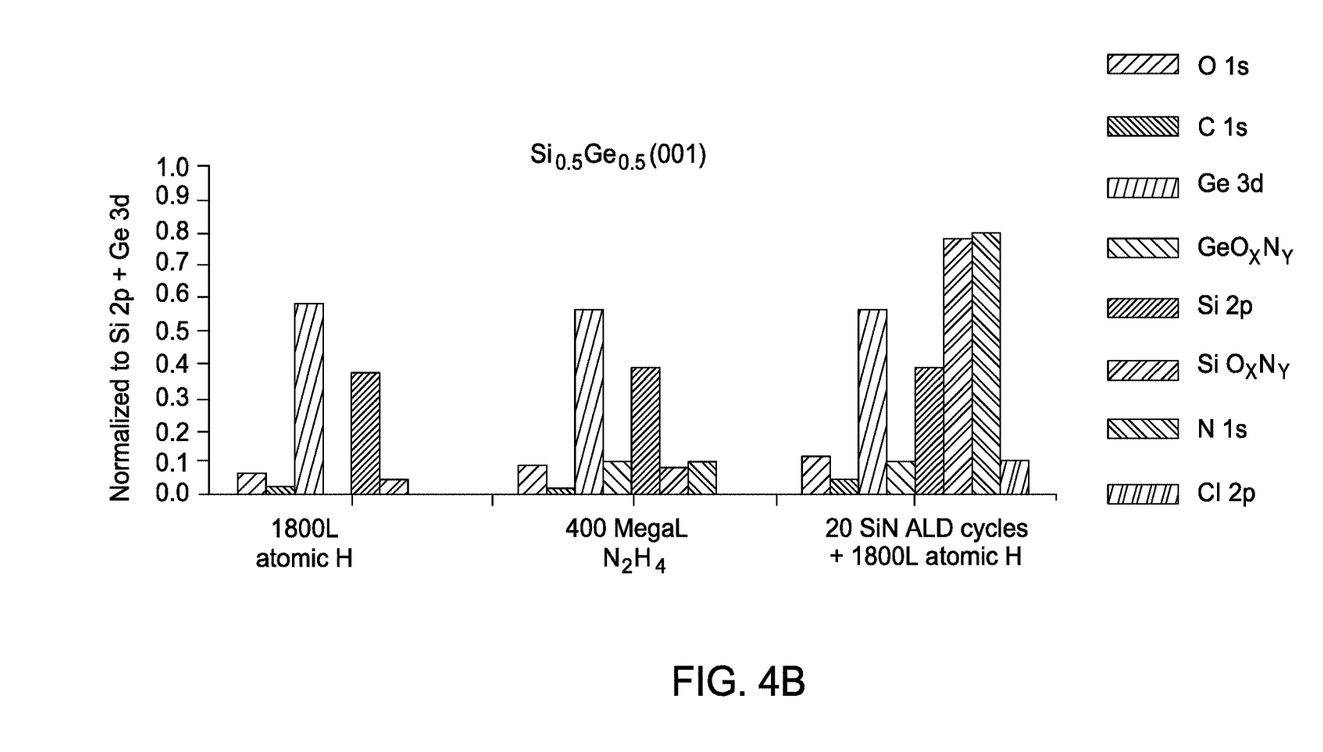
Figure 4C:
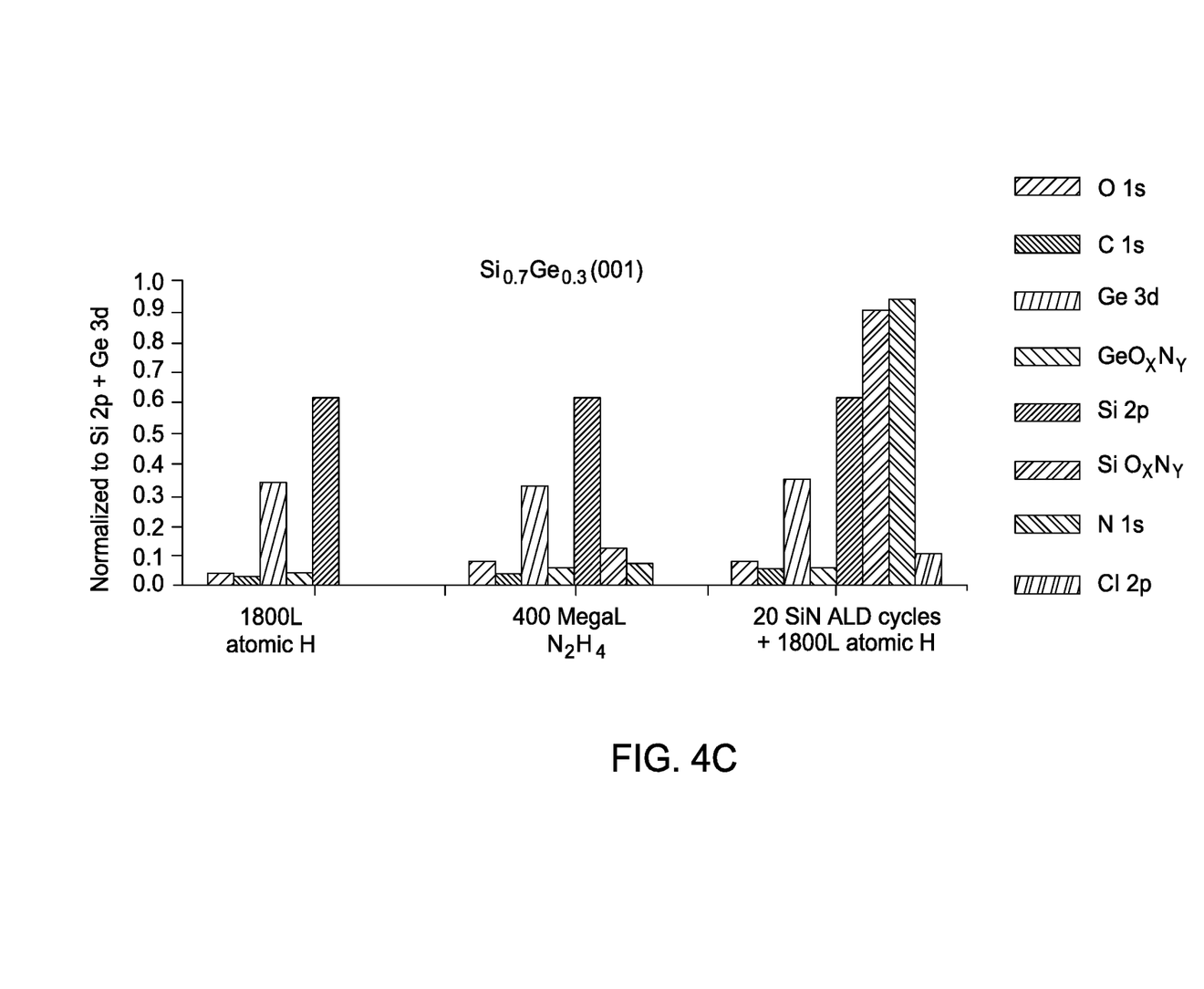

FIGS. 4A-C illustrate XPS surface compositions on $Si_{0.5}Ge_{0.5}(110)$ (FIG. 4A), $Si_{0.5}Ge_{0.5}(001)$ (FIG. 4B), $Si_{0.7}Ge_{0.3}(001)$ (FIG. 4C) after ALD cycles with gaseous $H_4N_2$ and gaseous $Si_2Cl_6$. Further illustrates in FIGS. 4A-C are XPS corrected peak areas of unshifted Si 2p, unshifted Ge 3d, $SiO_xN_y$, $GeO_xN_y$, O 1s, C 1s, N 1s, and Cl 2p normalized to the sum of unshifted Si 2p and unshifted Ge 3d peaks following an 1800 Langmuir atomic hydrogen dose at 330° C., 400 MegaLangmuir $H_4N_2$ dose at 285° C., and following an additional 20 $SiN_x$ ALD cycles and final atomic hydrogen dose at 285° C.

The XPS corrected peak areas normalized to the sum of the unshifted Si 2p and Ge 3d peaks, shown in FIGS. 4A-C, more clearly show the $SiN_x$ film growth on each substrate and for quantification of film thickness and stoichiometry. The final atomic hydrogen dose was employed after 20 ALD cycles in order to reduce residual chlorine species in the deposited film by inducing a gaseous HCl desorption byproduct. The equation $\ln(I/I_o)=-t/A$ was used to calculate the estimated deposited $SiN_x$ film thickness, where I is the intensity of the sum of unshifted Si 2p and Ge 3d peaks following the $H_4N_2$ dose and 20 $SiN_x$ ALD cycles, $I_o$ is the intensity of the sum of unshifted Si 2p and Ge 3d peaks following the $H_4N_2$ dose, "t" is the thickness of the deposited $SiN_x$ layer, and A is the inelastic mean free path of the Si 2p and Ge 3d collected electrons (2 nm). The deposited film is estimated to be a thin silicon rich $SiN_x$ film of approximately 0.7 nm thick on the $Si_{0.5}Ge_{0.5}(110)$ surface, and approximately 0.9 nm thick on the $Si_{0.5}Ge_{0.5}(001)$ and $Si_{0.7}Ge_{0.3}(001)$ surfaces.

Figure 5A:
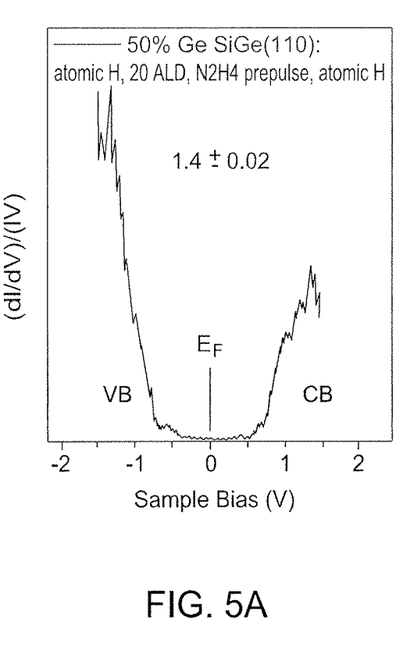
FIGS. 5A-C illustrate scanning tunneling spectroscopy (STS) measurements of $SiO_xN_y$/SiGe surfaces according to embodiments described herein.
Figure 5B:
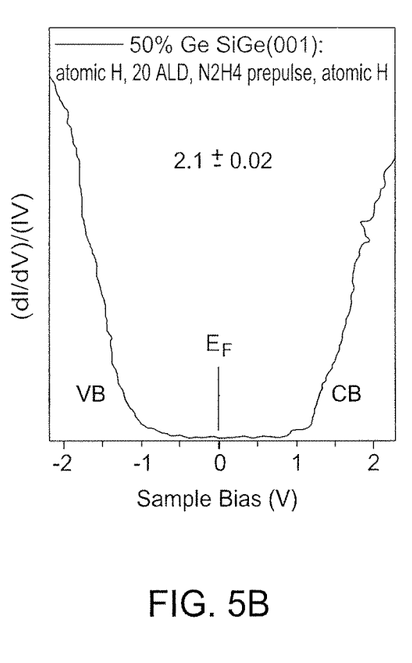
Figure 5C:
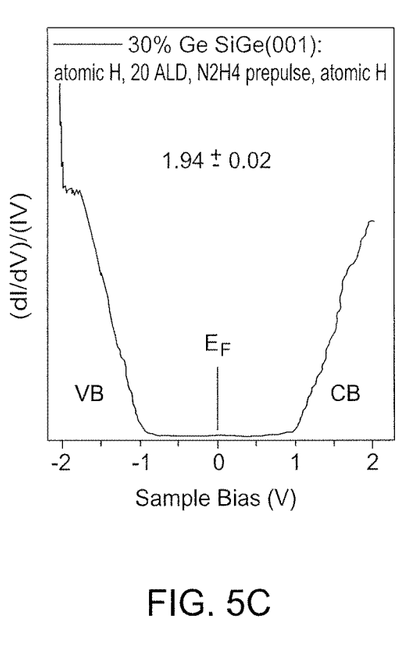

Next, scanning tunneling spectroscopy (STS) measurements were employed in order to probe the local surface density of states of the $SiO_xN_y$/SiGe surface as illustrated in FIGS. 5A-C. FIG. 5A illustrates a p-type $Si_{0.5}Ge_{0.5}(110)$, FIG. 5B illustrates a p-type $Si_{0.5}Ge_{0.5}(001)$, and FIG. 5C p-type $Si_{0.7}Ge_{0.3}(001)$, where the STS measurements were taken following an 1800 L atomic H dose at 330° C., an additional 400 MegaLangmuir $H_4N_2$ dose at 285° C., an additional 20 $SiN_x$ ALD cycles at 285° C., and a final 1800 L atomic H dose at 285° C. It should be noted the absence of band gap trap states indicative of surface passivation.

The $Si_{0.5}Ge_{0.5}(110)$ surface contains the thinnest deposited film (approximately 0.7 nm). The $Si_{0.5}Ge_{0.5}(110)$ surface also has the largest range of measured band gap energies with 40% of the curves showing a narrow band gap (1±0.02 eV) more reflective of the SiGe substrate, and 60% of the curves containing a larger band gap of approximately 1.4±0.02 eV. The results indicate the presence of various nitride stoichiometry seen across the surface during the initial 1-3 monolayers of $SiN_x$ nucleation and growth on the surface. It is believed that the $SiO_xN_y$ ALD nucleation on the (110) surface is more difficult with the surface containing smaller domains and increased disorder and roughness. The $Si_{0.5}Ge_{0.5}(001)$ and $Si_{0.7}Ge_{0.3}(001)$ surfaces contain a thicker deposited $SiO_xN_y$ film (approximately 0.9 nm) with 10% of surface curves showing an averaged narrow band gap (1.1±0.15 eV) and 90% of curves showing a measured averaged band gap of 2.1±0.02 eV on the $Si_{0.5}Ge_{0.5}(001)$ surface, and 1.94±0.01 eV on the $Si_{0.7}Ge_{0.3}(001)$ surface. All surfaces show the absence of band gap states indicative of surface passivation without formation of unwanted trap defect states. It is believed that with increasing deposited film thickness, the band gap increases towards that expected for a stoichiometric $Si_3N_4$ film.

Following XPS and STS, metal oxide semiconductor capacitors (MOSCAPs) were fabricated with and without the insertion of the $SiO_xN_y$ control layer on both $Si_{0.7}Ge_{0.3}$ (001) and $Si_{0.5}Ge_{0.5}(001)$ prior to $HfO_2$ deposition to investigate the electronic structure of the $SiO_xN_y$/SiGe interfaces. To deposit a thin $SiO_xN_y$ diffusion barrier and still maintain a low EOT, 10-15 cycles of $SiN_x$ ALD (with estimated thickness of 0.2-0.25 nm) were employed. In order to determine if more silicon rich $SiN_x$ film would improve the interface quality, a second $SiN_x$ recipe with half the $N_2H_4$ pulse length per ALD cycle was explored for MOSCAP fabrication. MOSCAPs were then fabricated following 20 $SiN_x$ ALD cycles with half the $N_2H_4$ pulse length per cycle to achieve an $SiN_x$ film thickness of approximately 0.2 nm.

Figure 6:
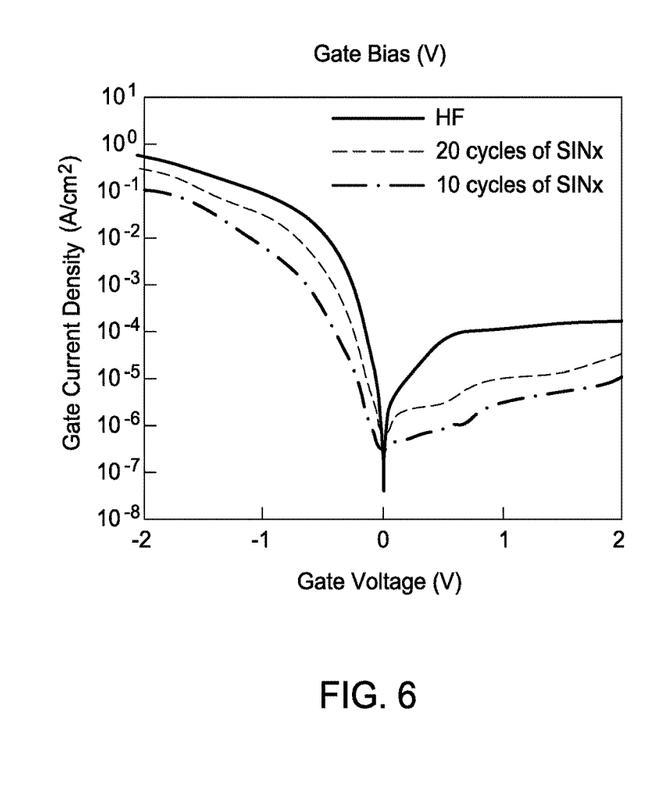
FIG. 6 illustrates gate leakage characteristics of metal oxide semiconductor capacitors (MOSCAPs) according to embodiments described herein.

FIG. 6 illustrates gate leakage characteristics of $Si_{0.7}Ge_{0.3}$ (001) MOSCAPs with 40 cycles of $HfO_2$ deposited by ALD fabricated following a cyclic HF clean, 20 cycles of SiNx ALD with 10 MegaLangmuir $H_4N_2$ pulses per cycle, and 10 cycles of SiNx ALD with 20 MegaLangmuir $H_4N_2$ pulses per cycle, respectively. The device with HF clean indicated a higher maximum capacitance in accumulation ($C_{max}$) values, a large interface trap feature (known as the $O_{it}$ bump) was observed near the flat band region. In comparison, MOSCAPs with $SiN_x$ interfacial layer showed smaller $O_{it}$ bumps as well as smaller $C_{max}$. The lower $C_{max}$ is consistent with the SiOxNy layer having a sufficient band gap to prevent accumulation of electrons in the SiOxNy layer. Moreover, addition of $SiN_x$ at the interface improved the gate leakage characteristics by lowering the max gate leakage in accumulation by almost an order of magnitude. While the two MOSCAPs with SiNx layers have similar $C_{max}$ values, 10 cycles of $SiN_x$ ALD with longer $H_4N_2$ pulse resulted in smaller $O_{it}$ bump and lowest gate leakage, indicating the $SiN_x$ ALD recipe with full saturation of the $H_4N_2$ pulse leads to a better interface quality with less chlorine and more nitrogen in the film.

Figure 7:
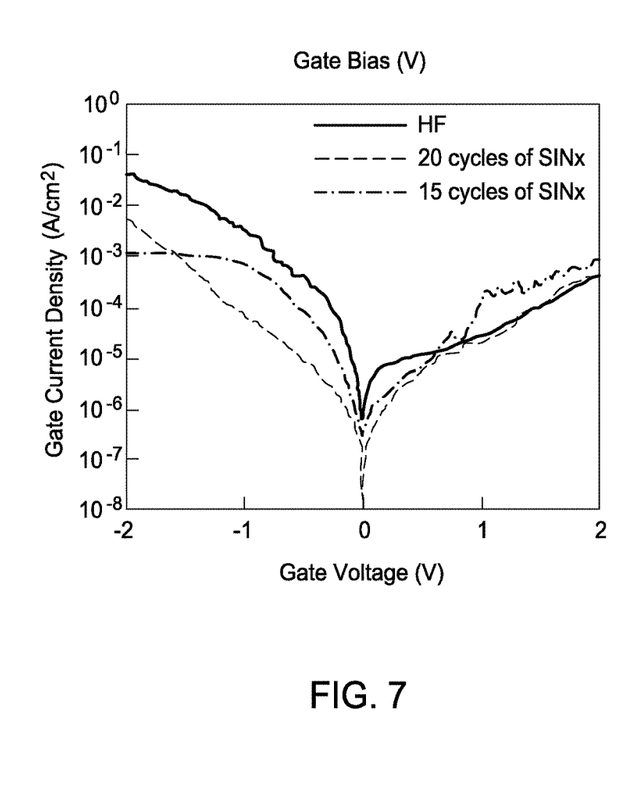
FIG. 7 illustrates gate leakage characteristics of MOSCAPs according to embodiments described herein.

FIG. 7 illustrates gate leakage characteristics of $Si_{0.5}Ge_{0.5}$ (001) MOSCAPs with 45 cycles of $HfO_2$ deposited by ALD fabricated following a cyclic HF clean, and 40 cycles of $HfO_2$ deposited by ALD fabrication following 20 cycles of SiNx ALD with 10 MegaLangmuir $H_4N_2$ pulses per cycle and 15 cycles of SiNx ALD with 20 MegaLangmuir $H_4N_2$ pulses per cycle, respectively.

The experimental analysis illustrated a self-limiting and saturating reaction of anhydrous hydrazine on semiconductor and metal surfaces at 275° C. Chamber heating and pumping configurations demonstrated elimination of ammonium-chloride like powder byproduct formation. Chamber heating and MegaLangmuir high pressure pulsing of anhydrous hydrazine and $Si_2Cl_6$ at 275° C. was demonstrated to deposit thin $SiN_x$ films on varying Ge content SiGe(001) substrates for MOSCAP fabrication. MOSCAP fabrication on SiGe substrates of 30% Ge and 50% Ge content with $SiO_xN_y$ thin film surface passivation layer was demonstrated to investigate the interfacial electrical properties. The results indicated that a beneficial control layer and device structures may be obtained according to the embodiments described herein.

The ALD deposited silicon nitride control layer is suitable for use as a semiconductor functionalization protection layer while providing protection in vacuum from oxidation and carburization. It is believed the control layer is advantageous during deposition and processing of gate stacks on fin field effect transistors (FinFETs). By generating Si—Nx terminated surfaces, the semiconductor substrate is chemically protected at all times and the layer can be transferred within a semiconductor processing tool.

It is believed the embodiments described herein may also be advantageously employed for planar MOSFETs or gate-all-around (GAA) FET gate dielectric processing. In addition, the Si—$N_x$ termination provided by the above described embodiments are believed to be useful for MOSFETs, FINFETs and GAAFETs source and drain (S/D) contact interface. For advanced node structures, metal-insulator-semiconductor (MIS) contacts may be applied instead of silicide contacts for Rc scaling embodiments described herein can be utilized to form ultra-thin tunneling metal oxide for MIS integration.

While the foregoing is directed to embodiments of the present disclosure, other and further embodiments of the disclosure may be devised without departing from the basic scope thereof, and the scope thereof is determined by the claims that follow.

What is claimed is:

1. A substrate process method, comprising:
   (a) functionalizing a substrate surface by exposing the substrate surface to a hydrazine ($N_2H_4$) material in a reaction chamber environment;
   (b) exposing the functionalized substrate surface to a silicon chloride material in the reaction chamber environment; and
   (c) repeating (a) and (b) while the reaction chamber environment is maintained at a temperature below about 300° C., wherein a $SiN_x$ termination layer is formed on the substrate surface.

2. The method of claim 1, wherein (c) the repeating of (a) and (b) is performed until a thickness of the $SiN_x$ termination layer from 0.2 nm to 0.9 nm is achieved.

3. The method of claim 2, wherein the $SiN_x$ termination layer is deposited one $SiN_x$ monolayer at a time until the thickness of claim 2 is achieved.

4. The method of claim 1, further comprising:
   purging the reaction chamber environment between (a) the exposing the substrate surface to a hydrazine material and (b) the exposing the substrate surface to a silicon chloride material.

5. The method of claim 4, wherein the purging comprises delivering an inert gas to the reaction chamber environment.

6. The method of claim 1, wherein the substrate surface comprises one or more of indium gallium arsenide (InGaAs), indium gallium antiminide (InGaSb), indium gallium nitride (InGaN), silicon germanium (SiGe), germanium, silicon, metallic substrates, and alloys and combinations thereof.

7. The method of claim 1, wherein the temperature is maintained at about 275° C.

8. The method of claim 1, wherein the silicon chloride material comprises a material comprising $Si_xCl_yH_z$, where y>z.

9. The method of claim 1, wherein the silicon chloride material is selected from the group consisting of $SiCl_4$, $Si_2Cl_6$, and $Si_3Cl_8$.

10. The method of claim 1, further comprising:
    removing a gaseous HCl byproduct from the reaction chamber environment.

11. A substrate process method, comprising:
    exposing a substrate to hydrogen to preclean a surface of the substrate in a reaction chamber environment;
    exposing the substrate to a hydrazine material in a first exposure operation;
    exposing the substrate to a silicon chloride material in a second exposure operation;
    exposing the substrate to the hydrazine material in a third exposure operation, wherein an amount of hydrazine material utilized in the third exposure operation is less than an amount of hydrazine material utilized in the first exposure operation;
    exposing the substrate to the silicon chloride material in a fourth exposure operation, wherein an amount of silicon chloride material utilized in the fourth exposure operation is less than an amount of silicon chloride material utilized in the second exposure operation; and
    repeating the third exposure operation and the fourth exposure operation, wherein the reaction chamber environment is maintained at a temperature below about 300° C., wherein a $SiN_x$ termination layer is formed on the surface of the substrate.

12. The method of claim 11, wherein exposing a substrate to hydrogen comprises delivering 1800 Langmuir H to the reaction chamber environment.

13. The method of claim 12, wherein the reaction chamber environment is maintained at about 330° C.

14. The method of claim 11, wherein the amount of hydrazine material utilized in the first exposure operation is about 315 MegaLangmuir.

15. The method of claim 11, wherein the amount of silicon chloride material utilized in the second exposure operation is about 21 MegaLangmuir.

16. The method of claim 11, wherein the amount of hydrazine material utilized in the third exposure operation is about 3 MegaLangmuir.

17. The method of claim 11, wherein the amount of silicon chloride material utilized in the fourth exposure operation is about 3 MegaLangmuir.

18. A substrate process method, comprising:
    heating a reaction chamber environment to a temperature of greater than about 100° C.;
    subsequent to the heating of the reaction chamber environment, precleaning a substrate in the reaction chamber environment;
    functionalizing a surface of the substrate by exposing the precleaned substrate to a hydrazine ($N_2H_4$) material;
    subsequent to functionalizing the surface of the substrate, purging the reaction chamber environment;

subsequent to purging the reaction chamber environment, exposing the functionalized surface of the substrate to a $Si_2Cl_6$ material in the reaction chamber environment; and subsequently, sequentially repeating the exposing the substrate to a hydrazine material, the purging the reaction chamber environment, and the exposing the substrate to a $Si_2Cl_6$ material, wherein the reaction chamber environment is maintained at a temperature below about 300° C., wherein a $SiN_x$ termination layer is formed on the surface of the substrate.

19. The method of claim 18, wherein the temperature is maintained at about 275° C.

20. The method of claim 18, further comprising:
removing a gaseous HCl byproduct from the reaction chamber environment.

* * * * *